United States Patent
Tseng et al.

(10) Patent No.: US 9,899,308 B2
(45) Date of Patent: Feb. 20, 2018

(54) SEMICONDUCTOR PACKAGE AND METHOD OF FABRICATING THE SAME

(71) Applicant: Siliconware Precision Industries Co., Ltd., Taichung (TW)

(72) Inventors: Wen-Tsung Tseng, Taichung (TW); Yi-Che Lai, Taichung (TW); Shih-Kuang Chiu, Taichung (TW); Mao-Hua Yeh, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/434,599

(22) Filed: Feb. 16, 2017

(65) Prior Publication Data

US 2017/0229387 A1 Aug. 10, 2017

Related U.S. Application Data

(62) Division of application No. 14/259,629, filed on Apr. 23, 2014, now Pat. No. 9,607,939.

(30) Foreign Application Priority Data

Sep. 9, 2013 (TW) .............................. 102132379 A (51) Int. Cl.
| | |
|---|---|
| H01L 21/48 | (2006.01) |
| H01L 23/13 | (2006.01) |
| H01L 23/14 | (2006.01) |
| H01L 23/373 | (2006.01) |
| H01L 23/498 | (2006.01) |

(52) U.S. Cl.
CPC ...... *H01L 23/49827* (2013.01); *H01L 21/481* (2013.01); *H01L 21/4853* (2013.01); *H01L 23/13* (2013.01); *H01L 23/147* (2013.01); *H01L 23/3738* (2013.01); *H01L 23/49816* (2013.01); *H01L 23/49838* (2013.01); *H01L 23/49894* (2013.01)

(58) Field of Classification Search
CPC .......... H01L 23/49827; H01L 23/3128; H01L 23/49816; H01L 23/3114; H01L 23/481; H01L 21/76898; H01L 23/49838; H01L 23/5384; H01L 23/3738; H01L 23/49894; H01L 23/147; H01L 23/13; H01L 21/486; H01L 21/4853; H01L 21/481
See application file for complete search history.

(56) References Cited

U.S. PATENT DOCUMENTS

| | | | |
|---|---|---|---|
| 7,592,700 B2 | 9/2009 | Sunohara et al. | |
| 9,040,419 B2* | 5/2015 | Son | H01L 23/481 257/621 |
| 2009/0166811 A1* | 7/2009 | Fujii | H01L 21/76898 257/621 |
| 2012/0205816 A1 | 8/2012 | Son et al. | |

* cited by examiner

*Primary Examiner* — Jasmine Clark
(74) *Attorney, Agent, or Firm* — Mintz Levin Cohn Ferris Glovsky and Popeo, P.C.; Peter F. Corless; Steven M. Jensen (57) ABSTRACT

A semiconductor package is provided, including a semiconductor substrate having a plurality of conductive vias, a buffer layer formed on the semiconductor substrate, a plurality of conductive pads formed on end surfaces of the conductive vias and covering the buffer layer. During a reflow process, the buffer layer greatly reduces the thermal stress, thereby eliminating the occurrence of cracking at the interface of conductive pads. A method of fabricating such a semiconductor package is also provided.

28 Claims, 7 Drawing Sheets

SEMICONDUCTOR PACKAGE AND METHOD OF FABRICATING THE SAME

CROSS-REFERENCE TO RELATED APPLICATION(S)

This application is a divisional of application U.S. Ser. No. 14/259,629, filed on Apr. 23, 2014, now U.S. Pat. No. 9,607,939, which claims under 35 U.S.C. §119(a) the benefit of Taiwanese Patent Application No. 102132379 filed Sep. 9, 2013, the entire contents of which are incorporated herein by reference.

BACKGROUND OF THE INVENTION

1. Field of the Invention

The present invention relates to semiconductor packages and methods of fabricating the same, and more particularly to a semiconductor package having a semiconductor chip with high inputs/outputs and a method of fabricating the same.

2. Description of the Prior Art

As the technology for developing electronic products is steadily growing, electronic products have now moved to multi-functionality and high functionality. The semiconductor packaging technology has been widely used nowadays includes chip scale package (CSP), Direct Chip Attached (DCA), Multi Chip Module (MCM), and 3D-IC stacking technology.

Figure 1:
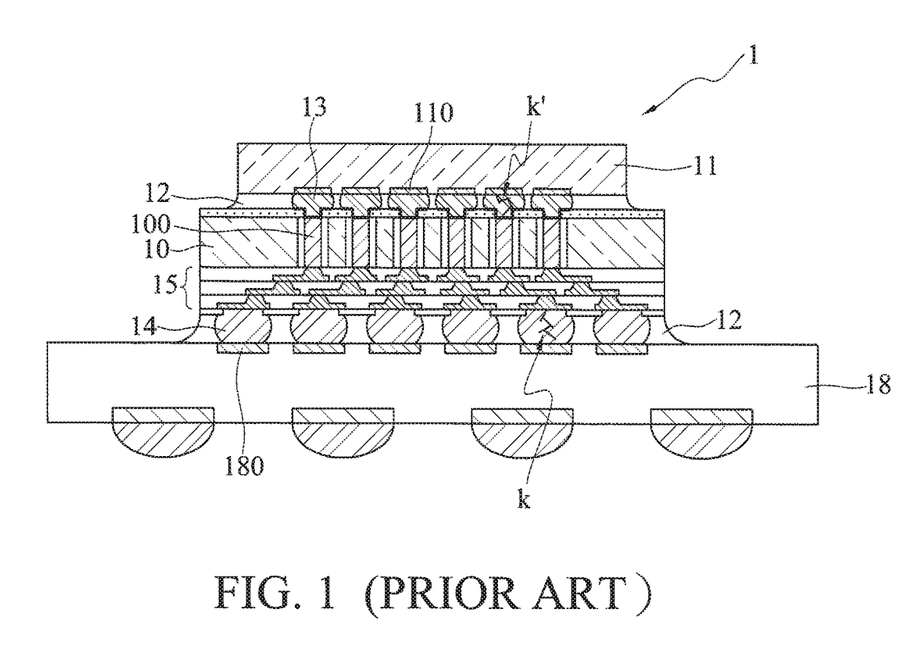
FIG. 1 is a cross-sectional view of a conventional semiconductor package.

FIG. 1 is a schematic cross-sectional view of a conventional semiconductor package 1, wherein a through silicon interposer (TSI) 10 is formed between the substrate 18 and a semiconductor chip 11. The TSI 10 has a plurality of through-silicon vias (TSVs) 100 and a redistribution layer (RDL) 15 formed on the through-silicon vias (TSVs) 100, allowing the redistribution layer 15 to be electrically connected through the plurality of conductive elements 14 with solder pads 180 on the substrate 18. The spacing distance between the solder pads 180 is greater than that of the conductive elements 14. The conductive elements 14 are covered by an adhesive material, and the electrode pads 110 of the semiconductor chip 11 are electrically connected to the through-silicon vias (TSV) 100 through a plurality of solder bumps 13. An adhesive material is then applied to cover the solder bumps 13.

If the semiconductor chip 11 is directly attached to the substrate 18, since the heat expansion coefficient difference between the smaller semiconductor chip and circuit substrate is rather large, it is difficult to establish a good bonding between the solder bumps 13 on the periphery of the chip 11 and the corresponding solder pads 180, causing the solder bumps 13 to be easily detached from the substrate 18. In addition, due to problems associated with thermal stress and warpage as a result of mismatch of heat expansion coefficient between semiconductor chip and substrate, the reliability between the semiconductor chip and the substrate is decreased causing frequent failures in reliability test.

Accordingly, by providing an interposer 10 made of silicon in the fabricating process of the semiconductor substrate, since the material thereof is similar to the semiconductor chip 11, the conventional problems can be solved.

In addition, through the design of the interposer 10, the disposing area of the semiconductor package can be further reduced in comparison with a flip-chip package. Generally, in the flip-chip package, the minimum line width or space of conductive traces is 12/12 μm. Therefore, the disposing area must increase to meet the requirement for semiconductor chip with high inputs/outputs(I/O). Providing interposer 10 in the fabricating process, it is possible to have line width and space under 3/3 μm, allowing the semiconductor chip 11 to be electrically connected with the substrate 18 through the interposer without the need to increase the area of the substrate 18.

In addition, in the interposer 10 design, due to the property of fine trace lines, and small line width, the distance for electricity transmission is relatively shorter. Therefore, the overall electricity transmission speed of the semiconductor chip 11 on the interposer is faster in comparison with the flip-chip package.

However, the disadvantage for fabricating the conventional semiconductor package 1 is the reflow process performed to solder the interposer 10 on the substrate 18. This creates thermal stress to be focused on the interface between the conductive element 14 and conductive vias, as shown as the thermal concentrated area K' in FIG. 1, causing the interface between the conductive elements 14 and conductive vias 100 (or the redistribution layer 15) to be cracked, thereby undesirably reducing the reliability and yield of the final product.

Therefore, there is an urgent need in solving the foregoing problems.

SUMMARY OF THE INVENTION

In light of the foregoing drawbacks of the prior art, the present invention proposes a semiconductor package, comprising: a semiconductor substrate having a plurality of conductive vias each having an end surface exposed from the semiconductor substrate; a buffer layer formed on the semiconductor substrate, with the end surfaces of the conductive vias exposed therefrom; and a plurality of conductive pads formed on the end surfaces of the conductive via and covering the buffer layer.

The present invention further proposes a method of fabricating a semiconductor package, comprising: providing a semiconductor substrate having a plurality of conductive vias each having an end surface exposed from the semiconductor substrate; forming on the semiconductor substrate a buffer layer with the end surfaces of the conductive vias exposed therefrom; and forming on the end surfaces of the conductive vias a plurality of conductive pads electrically connected with the conductive vias and covering the buffer layer.

In an embodiment, the semiconductor substrate has an insulative layer formed on a surface thereof, and the buffer layer is formed on the insulative layer in such a way that the insulative layer has a surface flush with the end surfaces of the conductive vias. In an embodiment, the insulative layer is made of silicon oxide, silicon nitride, or PBO.

In an embodiment, the buffer layer is formed around the end surfaces of the conductive vias, in such a way that the buffer layer is flush with the end surfaces of the conductive vias.

In an embodiment, the buffer layer is further formed on a portion of the end surface of each of the conductive vias.

The present invention further proposes a semiconductor package, comprising: a semiconductor substrate having a plurality of conductive vias each having end surfaces exposed from the semiconductor substrate; a circuit redistribution structure having a plurality of pads and formed on the semiconductor substrate and the end surfaces of the conductive vias for electrically connecting with each of the conductive vias; a buffer layer formed on a portion of a surface of each of the pads; and a plurality of conductive pads, each formed on each of the pads, for electrically connecting with the pads and covering the buffer layer.

The present invention further proposes a method of fabricating a semiconductor package, comprising: providing a semiconductor substrate having a plurality of conductive vias each having end surfaces exposed to the semiconductor substrate; forming a circuit redistribution substrate having a plurality of pads on the semiconductor substrate and the end surfaces of the conductive vias; forming a buffer layer on a portion of a surface of each of the pads; and forming on the pads a plurality of conductive pads electrically connected with the pads and covering the buffer layer.

In an embodiment, the semiconductor substrate further has an insulative layer formed on a surface thereof, and the circuit redistribution substrate is formed on the insulative layer in such a way that the insulative layer has a surface flush with the end surfaces of the conductive vias. In an embodiment, the insulative layer is made of silicon oxide, silicon nitride, or PBO.

In an embodiment, the semiconductor substrate is a silicon-containing board.

In an embodiment, the buffer layer is in the shape of a ring.

In an embodiment, the buffer layer is made of PI, PBO or BCB.

In an embodiment, an UBM is further formed on the conductive pads.

In summary, the present invention utilizes the buffer layer to reduce the thermal stress created during reflow process performed to solder the conductive elements on the conductive pads, reducing the occurrence of cracking and thereby enhancing the reliability and yield of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

In addition, words such as "on", "top" and "a" are used to explain the preferred embodiment of the present invention only and should not limit the scope of the present invention.

FIGS. 2A-2E, are cross-sectional views showing a method of fabricating a semiconductor package 2 in accordance with a first preferred embodiment of the present invention.

Figure 2A:
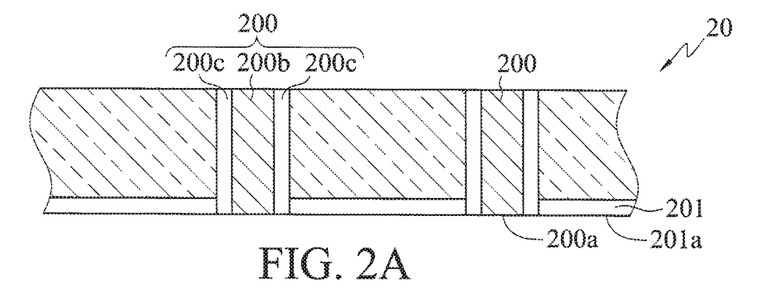
FIGS. 2A-2E, are cross-sectional views of a semiconductor package and a method of fabricating the same according to the present invention, wherein FIGS. 2C' and 2C" represent another embodiment of FIG. 2C, while FIGS. 2D' and 2D" represent another embodiment of FIG. 2D.

As shown in FIG. 2A, a semiconductor substrate 20 having a plurality of conductive vias 200 is provided. The end surfaces 200a of the conductive vias 200 are exposed from a surface of the semiconductor substrate 20.

In an embodiment, the semiconductor substrate 20 is a silicon-containing board, such as a Through-Silicon Interposer (TSI) or a glass substrate, and the conductive vias 200 are Through-Silicon vias (TSVs).

In an embodiment, the conductive vias 200 are made of the same material (but not limited to) such as the copper pillar 200b, and the insulative layer 200c surrounds the copper pillar 200b.

Moreover, an insulative layer 201 is formed on a surface of the semiconductor substrate 20, and has a surface flush with the end surfaces 200a of the conductive vias 200. In an embodiment, the insulative layer 201 is made of $SiO_2$, $Si_xN_y$, or Polybenzoxazole (PBO).

Since the conductive vias 200 are all fabricated by the same process, the following diagram is used to illustrate a process of fabricating a single conductive via 200 as an example.

Figure 2B:
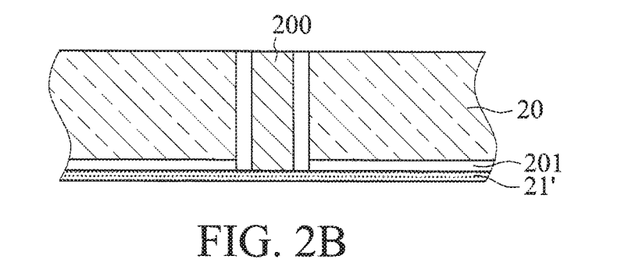

As shown in FIG. 2B, a buffer layer 21' is formed on the insulative layer 201 of the semiconductor substrate 20 and the end surfaces 200a of the conductive via 200.

In an embodiment, the buffer layer 21' is made of Polyimide (PI), Polybenzoxazole (PBO), or Benzocyciclobutene (BCB).

Figure 2C:
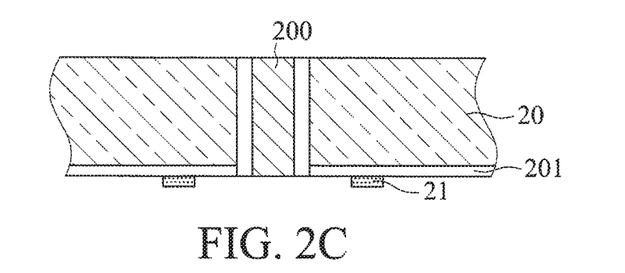

As shown in the 2C, a portion of the buffer layer 21' is removed by a patterning process, allowing the buffer layer 21' to be positioned around and exposed from the the end surfaces 200a of the conductive via 200.

In an embodiment, after the patterning process is performed, the buffer layer 21 is in the shape of a ring, and surrounds the end surface 200a of each of the conductive vias 200, as shown in FIG. 2C'. In other embodiments, the buffer layer 21 is in the shape of a rectangular ring (as the buffer layer 21" shown in FIG. 2C") or another geometry. In an embodiment, the ring is a continuous ring or a discontinuous ring (as shown in FIG. 2C").

Figure 2D:
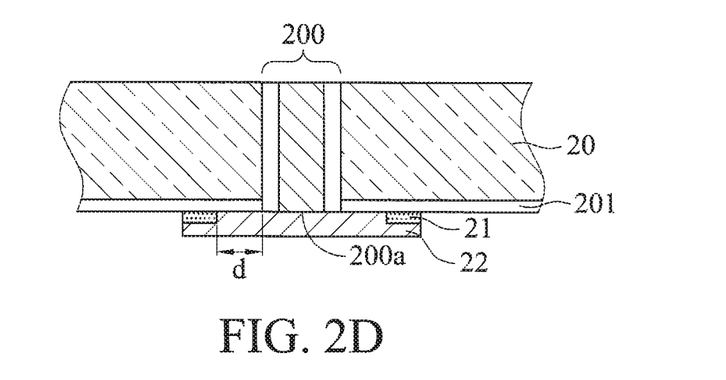

As shown in FIG. 2D, an conductive pad 22 is formed on the end surface 200a of each of the conductive vias 200 by a process of electroplating metal layer (such as copper), allowing the conductive pads 22 to be electrically connected with the conductive vias 200, and cover the buffer layer 21.

In an embodiment, a distance d is formed between the buffer layer 21 and the end surface 200a of each of the conductive vias 200. In other embodiments, the buffer layer 21a is flush with the periphery of the end surface 200a of each of the conductive vias 200, as shown in FIG. 2D'. Alternatively, the buffer layer 21b is further formed on a portion of the end surface 200a of each of the conductive via 200, as shown in FIG. 2D".

Figure 2E:
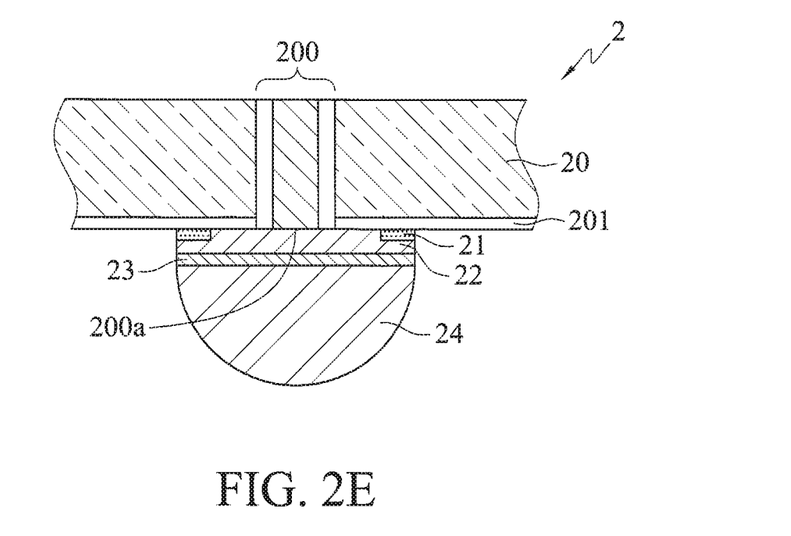

As shown in FIG. 2E, a conductive element 24 such as a solder ball is formed on each of the conductive pad 22, for the semiconductor chip or substrate to be mounted thereon.

In an embodiment, an under bump metallurgy (UBM) 23 is optionally formed on each of the conductive pad 22 for being bonded to the conductive element 24, such as a solder ball.

In addition, the structure and material of the under bump metallurgy (UBM) 23 can be selective from a variety of choices which are not specifically limited.

FIGS. 3A-3E are cross-sectional views showing a method of fabricating a semiconductor package 3 in accordance with a second preferred embodiment of the present invention. The method described in the second preferred embodiment differs from that described in the first preferred embodiment in the formation of the redistribution layer. Therefore, the same procedures will not be described herein.

Figure 3A:
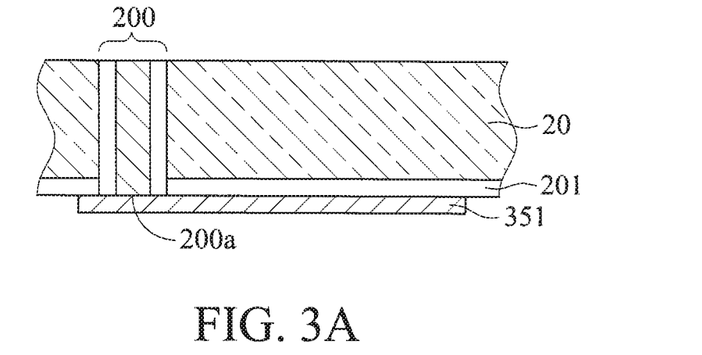
FIGS. 3A-3E, are cross-sectional views of a semiconductor package and a method of fabricating the same according to the present invention, wherein FIG. 3D' represents another embodiment of FIG. 3D, while FIG. 3E' represents another embodiment of FIG. 3E.
Figure 3B:
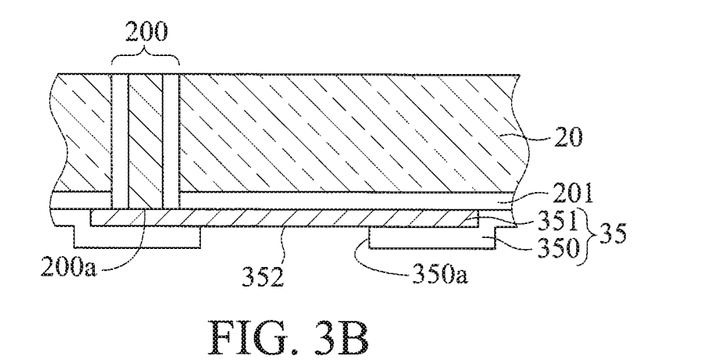

As shown in FIGS. 3A and 3B, followed by the steps shown in FIG. 2A, a circuit redistribution structure 35 is formed on the insulative layer 201 of the semiconductor substrate 20 and the end surfaces 200a of the conductive vias 200, and the circuit redistribution structure 35 is electrically connected with the conductive vias 200.

In an embodiment, the circuit redistribution structure 35 further comprises at least a circuit layer 351 and at least a dielectric layer 350, which are stacked on each other. The circuit layer 351 is formed on the insulative layer 201 of the semiconductor substrate 20 and is electrically connected with the conductive vias 200. The dielectric layer 350 is formed on the circuit layer 351 and the insulative layer 201. The circuit layer 351 has a plurality of pads 352. The dielectric layer 350 is formed with a plurality of openings 350 corresponding in position to the openings 350a of the pads 352, allowing the pads 352 to be exposed to the openings 350a.

In an embodiment, the dielectric layer 350 is made of $SiO_2$, $Si_xN_y$, or Polybenzoxazole (PBO).

Figure 3C:
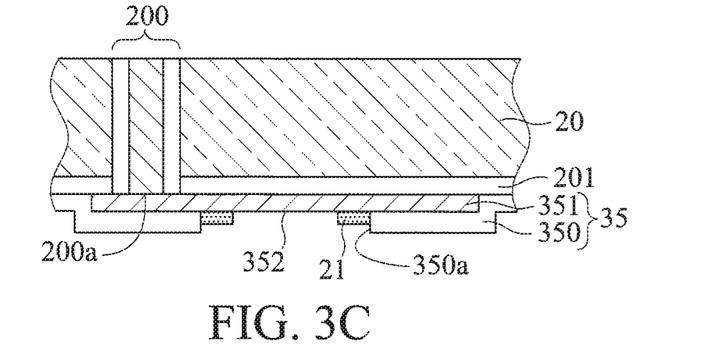

As shown in FIG. 3C, a buffer layer 21 is formed on a portion of a surface of each of the pads 352.

In an embodiment, the buffer layer 21 is formed as a continuous or discontinuous ring on the periphery of each of the pads 352 corresponding to the walls of the openings 350a.

Figure 3D:
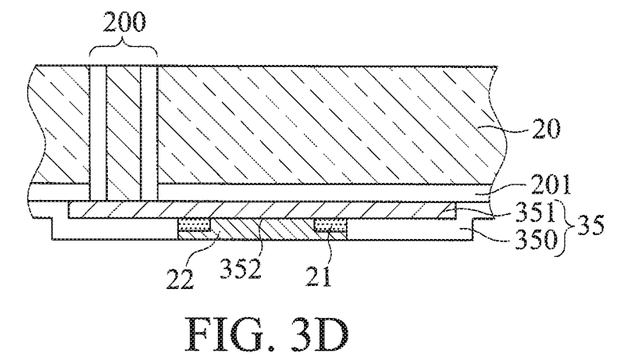

As shown in FIG. 3D, a conductive pad 22 is formed on each of the pad 352, allowing the conductive pads 22 to be electrically connected with the circuit layer 351 and cover the buffer layer 21.

In an embodiment, the conductive pad 22 is located in each of the opening 350a. In another embodiment, as shown in FIG. 3D', the conductive pads 22' also extend to the surface of the dielectric layer 350.

Figure 3E:
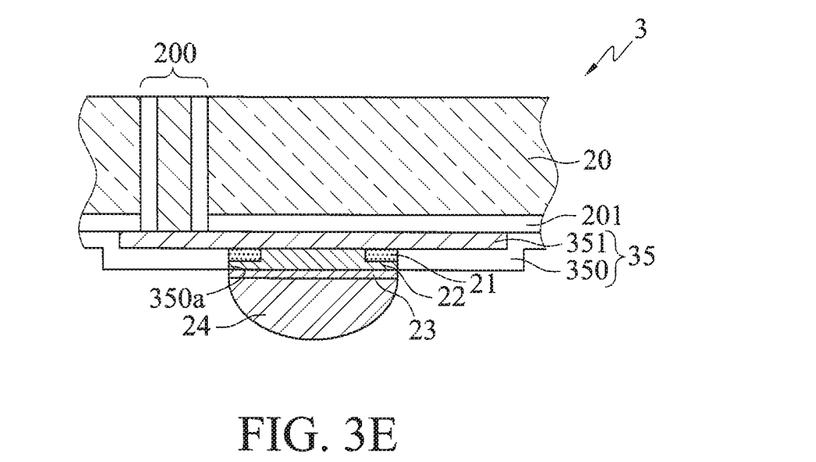

As shown in FIG. 3E, a UBM 23 is formed on each of the conductive pads 22, for being bonded to the conductive element 24 such as solder ball thereon.

In an embodiment, as shown in FIG. 3E', in an RDL process the circuit redistribution structure 35' has a plurality of circuit layers 351, 351' and dielectric layers 350, 350' which are stacked on one another. The pads 352 are positioned at the outermost portion of the circuit layer 351'.

In an embodiment, with the design of the conductive pad 22 that covers the buffer layer 21, when the conductive element 24 is reflowed to the semiconductor chip or substrate, the buffer layer 21 greatly reduces the thermal stress generated from heat. In comparison of the conventional technology, the experimental results show 24% of reduction in thermal stress. As a result, the semiconductor package 2, 3 provided according to the present invention is capable of eliminating the occurance of being cracked of the conductive elements 24, thereby greatly enhancing both the reliability and yield of the semiconductor package 2, 3.

A semiconductor package 2 is proposed according to the present invention, comprising: a semiconductor substrate 20 having a plurality of conductive vias 200, a buffer layer 21 formed on the semiconductor substrate 20, and a plurality of conductive pads 22 formed on the end surfaces 200a of the conductive vias 200.

In an embodiment, the semiconductor substrate 20 is a silicon-containing board having an insulative layer 201. The surface 201a of the insulative layer 201 is flush with the end surfaces 200a of the conductive vias 200, allowing the end surfaces 200a of the conductive vias 200 to be exposed from the surface 201a of the insulative layer 201. In an embodiment, the insulative layer 201 is made of $SiO_2$, $Si_xN_y$, or Polybenzoxazole (PBO).

In an embodiment, the buffer layer 21 is formed on the surface 201a of the insulative layer 201, and is exposed from the end surfaces 200a of the conductive vias 200. The buffer layer 21 is made of Polyimide (PI), Polybenzoxazole (PBO), or Benzocyciclobutene (BCB).

In an embodiment, the conductive pads 22 are electrically connected with the conductive via 200 and cover the buffer layer 21.

In an embodiment, the buffer layer 21, 21" is in the shape of a ring.

In another embodiment, the buffer layer 21, 21a is formed around the periphery of the end surface 200a of each of the conductive vias 200. The buffer layer 21a is flush with the end surfaces 200a of the conductive vias 200.

In an embodiment, the buffer layer 21b is formed on a portion of the end surface 200a of each of the conductive vias 200.

A semiconductor package 3 is also proposed by the present invention, comprising: a semiconductor substrate 20 having a plurality of conductive vias 200, a circuit redistribution structure 35, 35' formed on the semiconductor substrate 20 and the end surfaces 200a of the conductive vias 200, a buffer layer 21 formed on the circuit redistribution structure 35, 35', and a plurality of conductive pads 22 formed on the circuit redistribution structure 35, 35'.

In an embodiment, the semiconductor substrate 20 is a silicon-containing board having an insulative layer 201. The surface 201a of the insulative layer 201 is flush with the end surfaces 200a of the conductive vias 200, allowing the end surfaces 200a of the conductive vias 200 to be exposed to the surface 201a of the insulative layer 201. In an embodiment, the insulative layer 201 is made of $SiO_2$, $Si_xN_y$, or Polybenzoxazole (PBO). The circuit redistribution structure 35, 35' is formed on the insulative layer 201 and is electrically connected with the conductive vias 200. The circuit redistribution structure 35, 35' has at least one pad 352.

In an embodiment, the buffer layer 21 is formed on a portion of a surface of each of the pad 352. The buffer layer 21 is made of Polyimide (PI), Polybenzoxazole (PBO), or Benzocyciclobutene (BCB).

In an embodiment, the electrical connection pad 22 is formed on and electrically connected with the pad 352 and covers the buffer layer 21.

In an embodiment, the buffer layer 21, 21" is in the shape of a ring.

The circuit redistribution structure 35, 35' has at least a circuit layers 351, 351' and at least a dielectric layers 350, 350' which are stacked on each other. The circuit layer 351, 351' has a plurality of pads 352, and is electrically connected with the conductive vias 200. The dielectric layer 350, 350' is formed on the circuit layer 351, 351' and has a plurality of openings 350a that expose the pads 352. The buffer layer 21 is formed around the periphery of each of the pads 352, corresponding to the walls of the openings 350a. In an embodiment, the dielectric layer 350, 350' is made of $SiO_2$, $Si_xN_y$, or Polybenzoxazole (PBO).

In an embodiment, the semiconductor package 2, 3 further comprises a UBM 23 formed on the conductive pad 22.

In summary, the present invention utilizes the design of a buffer layer to reduce the thermal stress created during reflow process performed to solder the conductive elements on the conductive pads, reducing the occurrence of cracking and thereby enhancing the reliability and yield of the semiconductor package.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
    a semiconductor substrate having a plurality of conductive vias, each of the conductive vias having an end surface exposed from the semiconductor substrate;
    a circuit redistribution structure formed on the semiconductor substrate and the end surfaces of the conductive vias and electrically connected with the conductive vias, the circuit redistribution structure having a plurality of pads;
    a buffer layer formed on the circuit redistribution structure to cover a portion of the pads; and
    a plurality of conductive pads formed on the pads, electrically connected with the pads, and covering the buffer layer.

2. The semiconductor package of claim 1, wherein the semiconductor substrate has an insulative layer formed on a surface thereof, and the circuit redistribution structure is formed on the insulative layer.

3. The semiconductor package of claim 2, wherein the insulative layer has a surface flush with the end surfaces of the conductive vias.

4. The semiconductor package of claim 2, wherein the insulative layer is made of $SiO_2$, $Si_xN_y$, or Polybenzoxazole (PBO).

5. The semiconductor package of claim 2, wherein the circuit redistribution structure has at least a circuit layer and at least a dielectric layer stacked on each other, the at least a circuit layer has the pads and is electrically connected with the conductive vias, and the at least a dielectric layer formed on the at least a circuit layer, has openings that expose the pads.

6. The semiconductor package of claim 5, wherein the at least a dielectric layer is made of $SiO_2$, $Si_xN_y$, or Polybenzoxazole (PBO).

7. The semiconductor package of claim 5, wherein the buffer layer corresponds to walls of the openings and formed on a periphery of each of the pads.

8. The semiconductor package of claim 1, wherein the circuit redistribution structure has at least a circuit layer and at least a dielectric layer stacked on each other, the at least a circuit layer has the pads and is electrically connected with the conductive vias, and the at least a dielectric layer is formed on the at least a circuit layer and has openings that expose the pads.

9. The semiconductor package of claim 8, wherein the at least a dielectric layer is made of $SiO_2$, $Si_xN_y$, or Polybenzoxazole (PBO).

10. The semiconductor package of claim 8, wherein the buffer layer corresponds to walls of the openings and formed on a periphery of each of the pads.

11. The semiconductor package of claim 1, wherein the semiconductor substrate is a silicon-containing board.

12. The semiconductor package of claim 1, wherein the buffer layer is in the shape of a ring.

13. The semiconductor package of claim 1, wherein the buffer layer is made of olyimide (PI), Polybenzoxazole (PBO), or Benzocyciclobutene (BCB).

14. The semiconductor package of claim 1, further comprising an under bump metallurgy formed on each of the conductive pads.

15. A method of fabricating a semiconductor package, comprising:
    providing a semiconductor substrate having a plurality of conductive vias, each of the conductive vias having an end surface exposed from the semiconductor substrate;
    forming on the semiconductor substrate and the end surfaces of the conductive vias a circuit redistribution structure having a plurality of pads;
    forming a buffer layer on a portion of each of the pads; and
    forming on the pads a plurality of conductive pads electrically connected with the pads and covering the buffer layer.

16. The method of claim 15, wherein the semiconductor substrate has an insulative layer formed on a surface thereof, and the circuit redistribution structure is formed on the insulative layer.

17. The method of claim 16, wherein the insulative layer has a surface flush with the end surfaces of the conductive vias.

18. The method of claim 16, wherein the insulative layer is made of $SiO_2$, $Si_xN_y$, or Polybenzoxazole (PBO).

19. The method of claim 16, wherein the redistribution layer has at least a circuit layer and at least a dielectric layer stacked on each other, the at least a circuit layer has the pads and is electrically connected with the conductive vias, and the at least a dielectric layer is formed on the at least a circuit layer and has openings that expose the pads.

20. The method of claim 19, wherein the at least a dielectric layer is made of silicon oxide, silicon nitride, or PBO.

21. The method of claim 19, wherein the buffer layer corresponds to walls of the openings and is formed on a periphery of each of the pads.

22. The method of claim 15, wherein the semiconductor substrate is a silicon-containing board.

23. The method of claim 15, wherein the buffer layer is in the shape of a ring.

24. The method of claim 15, wherein the buffer layer is made of Polyimide (PI), Polybenzoxazole (PBO), or Benzocyciclobutene (BCB).

25. The method of claim 15, further comprising an under bump metallurgy formed on each of the conductive pads.

26. The method of claim 15, wherein the redistribution layer has at least a circuit layer and at least a dielectric layer stacked on each other, the at least a circuit layer has the pads and is electrically connected with the conductive vias, and the at least a dielectric layer is formed on the at least a circuit layer and has openings that expose the pads.

27. The method of claim 26, wherein the at least a dielectric layer is made of silicon oxide, silicon nitride, or PBO.

28. The method of claim 26, wherein the buffer layer corresponds to walls of the openings and is formed on a periphery of each of the pads.

* * * * *